(12) United States Patent
Kusama

(10) Patent No.: US 11,339,577 B2
(45) Date of Patent: May 24, 2022

(54) STOCKER AND METHOD FOR FORMING WORK PLATFORM

(71) Applicant: MURATA MACHINERY, LTD., Kyoto (JP)

(72) Inventor: Yu Kusama, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 532 days.

(21) Appl. No.: 16/487,206

(22) PCT Filed: Jan. 26, 2018

(86) PCT No.: PCT/JP2018/002456
§ 371 (c)(1),
(2) Date: Aug. 20, 2019

(87) PCT Pub. No.: WO2018/155076
PCT Pub. Date: Aug. 30, 2018

(65) Prior Publication Data
US 2021/0131125 A1 May 6, 2021

(30) Foreign Application Priority Data
Feb. 23, 2017 (JP) .............................. JP2017-032048

(51) Int. Cl.
*E04G 1/15* (2006.01)
*B65G 1/04* (2006.01)
*H01L 21/677* (2006.01)

(52) U.S. Cl.
CPC .............. *E04G 1/15* (2013.01); *B65G 1/0407* (2013.01); *H01L 21/67706* (2013.01); *H01L 21/67724* (2013.01); *H01L 21/67769* (2013.01)

(58) Field of Classification Search
CPC ......... H01L 21/67769; H01L 21/67706; H01L 21/67724; B65G 1/0407; E04G 1/15
See application file for complete search history.

(56) References Cited

U.S. PATENT DOCUMENTS

| 9,284,119 | B2* | 3/2016 | Tsujita | ................... H04N 5/77 |
| 9,327,952 | B1* | 5/2016 | Kolharkar | ............ B65G 1/1375 |
| 2015/0291356 | A1* | 10/2015 | Oki | ........................ B65G 1/137 |
| | | | | 414/807 |

FOREIGN PATENT DOCUMENTS

| EP | 2 020 388 B1 | 9/2010 |
| JP | 2008-019031 A | 1/2008 |

OTHER PUBLICATIONS

Official Communication issued in International Patent Application No. PCT/JP2018/002456, dated Mar. 27, 2018.

* cited by examiner

*Primary Examiner* — Saul Rodriguez
*Assistant Examiner* — Willie Berry, Jr.
(74) *Attorney, Agent, or Firm* — Keating & Bennett, LLP

(57) ABSTRACT

A stocker includes a transporter that travels through a traveling space within a stocker and transports an article, a pair of rails that flank the traveling space extend in parallel or substantially in parallel in a horizontal direction, platforms movable along the pair of rails, and a housing provided on a stocker outer side of a door that separates an inside and an outside of the stocker, and that houses the platforms. The pair of rails extend from the inside of the stocker to the housing through an opening directly under the door. At least one of the platforms includes a fence in an upright standing manner and an upper end of the fence is higher than an upper end of the opening. The platform that includes the fence extends across the inside of the stocker (Continued)

and the outside of the stocker via the opening while the fence is arranged on a stocker inner side.

7 Claims, 9 Drawing Sheets

STOCKER AND METHOD FOR FORMING WORK PLATFORM

BACKGROUND OF THE INVENTION

1. Field of the Invention

The present invention relates to a stocker and a method for forming a work platform.

2. Description of the Related Art

In semiconductor manufacturing factories and the like, a stocker is installed in order to store containers (articles) such as FOUPs accommodating semiconductor wafers or reticles and reticle pods. Such a stocker includes racks for placing articles thereon within the stocker and a transporter that travels within the stocker to transfer the articles. The racks are arranged in multiple stages in a vertical direction along a traveling space of the transporter. Formation of a work platform in such a stocker is known such that a plurality of platform members are arranged in the traveling space of the transporter in order to allow a worker to access upper racks at the time of trouble while accommodating articles or at the time of performing maintenance (for example, Japanese Unexamined Patent Application, First Publication No. 2008-019031).

In the stocker of Japanese Unexamined Patent Application, First Publication No. 2008-019031, a plurality of platform members are sequentially fed along a pair of rails flanking a traveling space and extending in parallel in the horizontal direction from a housing provided on the outside of a door that separates inside and outside of the stocker, to thereby form a work platform. A worker feeds the platform members onto the rails from the housing in the formation of such a work platform. However, the operation of feeding the leading platform member onto the rails is troublesome, and the burden on the worker is significant due to the operation having to be performed at a high place. Also, when the worker opens the door that separates the inside and the outside of the stocker while the work platform has not been formed, entry to the inside of the stocker is not restricted. Therefore, care must be taken as to opening and closing the door, and this places a burden on the worker.

SUMMARY OF THE INVENTION

Preferred embodiments of the present invention provide stockers and methods for forming a work platform capable of easy formation of a work platform to reduce the burden on a worker.

A stocker according to a preferred embodiment of the present invention includes a transporter that travels through a traveling space within a stocker and transports an article; a pair of rails flanking the traveling space and extending in parallel or substantially in parallel in a horizontal direction; a plurality of platform members movable along the pair of rails; and a housing provided on a stocker outer side of a door that separates an inside and an outside of the stocker, and houses the plurality of platform members; wherein the pair of rails extend from the inside of the stocker to the housing through an opening provided directly under the door, at least one of the plurality of platform members includes a fence in an upright standing manner and an upper end of the fence is higher than an upper end of the opening, and the platform member that includes the fence extends across the inside of the stocker and the outside of the stocker via the opening and the fence is arranged on a stocker inner side.

The fence may be provided on the platform member that is firstly fed onto the pair of rails. The fence may include a plurality of struts that extend upward from the platform member, and a plurality of horizontal portions between the plurality of struts, and the horizontal portion positioned topmost may be set higher than a position of the waist of a worker standing on the platform member. The platform members other than the platform member that includes the fence among the plurality of platform members may be housed within the housing in a state of being stacked when the transporter travels.

The transporter may include a traveler that travels through the traveling space; a mast which is provided in a vertical direction from the traveler, an outer circumferential portion of the mast being of an arc shape in plan view; and a transfer unit that is raised or lowered along the mast. In the platform member that is closest to the mast among the plurality of platform members there may be provided a cutout into which a portion of the mast enters.

A method for forming a work platform according to a preferred embodiment of the present invention is a method for forming a work platform in a stocker including a transporter that travels through a traveling space within a stocker and transports an article, the stocker including a pair of rails that flank the traveling space and extend in parallel or substantially in parallel in a horizontal direction; a plurality of platform members movable along the pair of rails; and a housing that is provided on a stocker outer side of a door that separates an inside and an outside of the stocker, and that houses the plurality of platform members; and the pair of rails extend from the inside of the stocker to the housing through an opening provided directly under the door; at least one of the plurality of platform members includes a fence in an upright standing manner and an upper end of the fence is higher than an upper end of the opening; the method including housing the platform members other than the platform member that includes the fence among the plurality of platform members within the housing in a state of being stacked when the transporter travels, arranging across the inside of the stocker and the outside of the stocker via the opening the platform member that includes the fence while arranging the fence on an inner side of the stocker; and feeding, after the platform member that includes the fence, the platform members sequentially onto the pair of rails within the stocker through the opening from the housing when the transporter stops.

According to stockers and methods for forming a work platform of preferred embodiments of the present invention, the platform member that includes the fence extends across the inside of the stocker and the outside of the stocker via the opening while the fence is arranged on a stocker inner side. Therefore, the worker can easily and simply form a work platform by feeding, after the platform member that includes the fence, the other platform members from the housing sequentially onto the rails, thus reducing the burden on the worker. When the worker opens the door of the stocker while the work platform has not been formed, the fence is standing upright close to the stocker inner side with respect to the door. Therefore, entry of the worker into the stocker through the door is able to be restricted.

In a case where the fence is provided on the platform member that is firstly fed onto the pair of rails, it is possible to easily form a work platform that includes the fence at a leading position thereof, and when the platform members are not in use, the fence is able to be positioned near the inner side of the door. In a case where the fence includes a plurality of struts that extend upward from the platform member and a plurality of horizontal portions arranged between the plurality of struts, and the horizontal portion positioned topmost is set higher than a position of the waist of a worker standing on the platform member, rigidity of the fence is able to be improved by the plurality of struts and the plurality of horizontal portions. Also, since the horizontal portion positioned topmost is higher than the position of the waist of a worker, the topmost horizontal portion is able to function as an effective fence for the worker. In a case where the platform members other than the platform member having the fence provided thereon among the plurality of platform members are housed within the housing in a state of being stacked when the transporter travels, the plurality of platform members are able to be efficiently stored in the housing.

In a case where the transporter includes a traveler that travels through the traveling space; a mast extending in a vertical direction from the traveler, an outer circumferential portion of the mast being of an arc shape in plan view; and a transfer unit that is raised or lowered along the mast, articles are able to be transferred efficiently by the transporter. In a case where a cutout into which a portion of the mast intrudes is provided in the platform member which is closest to the mast among the plurality of platform members, by having the portion of the mast intruding into the cutout, the platform member is able to be arranged close to the mast, an outer circumferential portion of which has an arc shape. Accordingly, since the gap between the mast and the platform member is made small, falling of objects through the gap is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
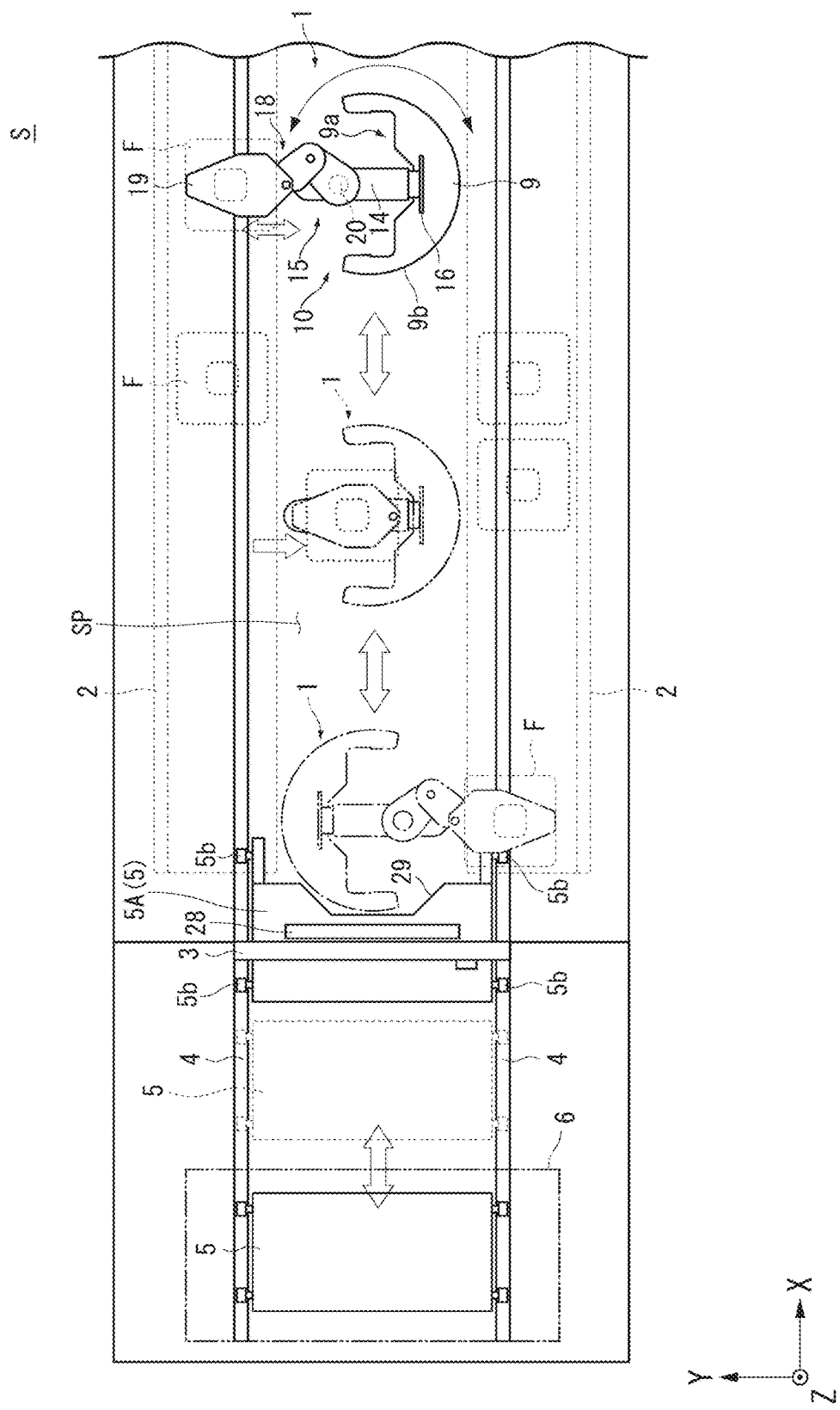
FIG. 1 is a plan view showing an example of a stocker according to a preferred embodiment of the present invention.

The following describes preferred embodiments of the present invention with reference to the drawings. However, the present invention is not limited to the preferred embodiments. In the drawings, the scale is changed as necessary to illustrate the preferred embodiments, such as by enlarging or by emphasizing a portion. In the following drawings, an XYZ coordinate system is used to describe the directions in each drawing. In the XYZ coordinate system, a plane that is parallel to a horizontal plane is defined as an XY plane. In the XY plane, a traveling direction of a transporter 1 is denoted as an X direction and a direction orthogonal to the X direction in the horizontal direction is denoted as a Y direction. A direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction.

Figure 2:
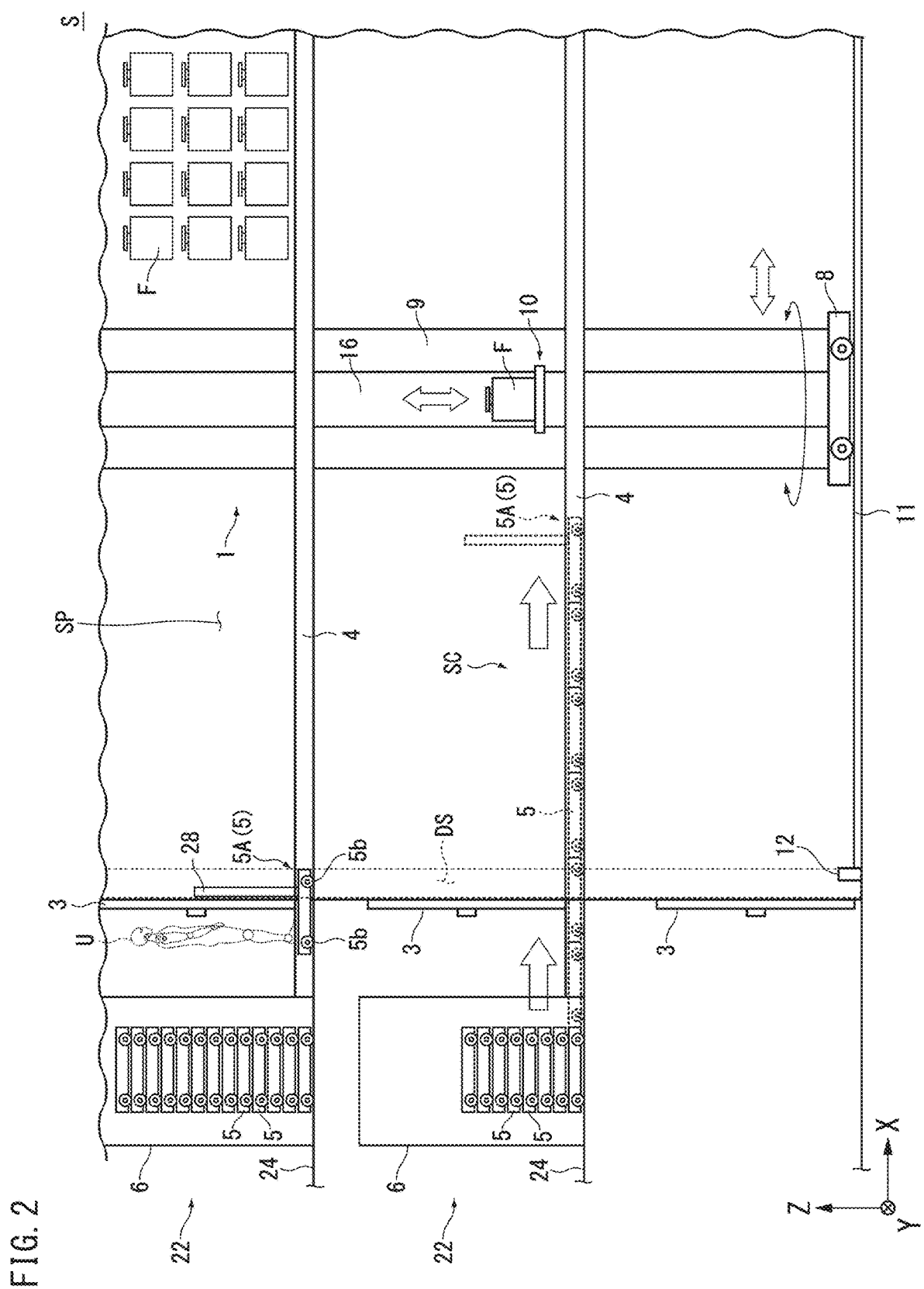
FIG. 2 is a front elevation view of the stocker shown in FIG. 1.

FIG. 1 and FIG. 2 are diagrams conceptually showing an example of a stocker according to a preferred embodiment of the present invention. FIG. 1 is a top view as viewed from the +Z side. FIG. 2 is a front elevation view as viewed from the −Y side.

A stocker S is installed, for example, in a semiconductor manufacturing factory and stores articles F, examples of which include a container such as a FOUP accommodating semiconductor wafers and a reticle pod accommodating a processing member such as a reticle. A transporter 1 of the present preferred embodiment is a stacker crane, for example. The stocker S has an internal space that is able to be isolated from the outside. The stocker S includes an incoming/outgoing port (not shown in the drawings) through which the articles F are transferred between the outside of the stocker S and the internal space. The stocker S includes the transporter 1, storage racks 2, a door 3, a pair of rails 4, platform members 5, and a housing 6.

The storage racks 2 are arranged inside the stocker S and accommodate the articles F. A plurality of the storage racks 2 are provided. The storage racks 2 are arranged on both sides (+Y side and −Y side) of a direction (Y direction) intersecting with a moving direction (X direction) of the transporter 1. Each storage rack 2 includes a plurality of rack plates and vertical plates, and can accommodate a plurality of articles F.

The transporter 1 travels through a traveling space SP within the stocker S and transports articles F. The traveling space SP is provided between the storage racks 2 on the +Y side and the −Y side. The transporter 1 includes travelers 8 (see FIG. 2), a mast 9, and a transfer unit 10.

The traveler 8 of FIG. 2 travels along tracks 11 (not shown in the drawings). The tracks 11 are provided in an upper portion (not shown in the drawings) and a lower portion within the stocker S, respectively. The upper and lower tracks 11 are both provided between the storage racks 2 on the +Y side and the −Y side. The upper and lower tracks 11 are each arranged in a direction parallel or substantially parallel to the X direction. On the −X side of each of the upper and lower tracks 11, a stopper 12 is provided to restrict the traveling of the travelers 8. The stopper 12 restricts a travel range of the traveler 8. The traveler 8 includes a traveling driver such as an electric motor, a speed reducer, a drive wheel, an encoder, and so forth. The drive wheel is arranged so as to be in contact with the track 11, and is connected to an output axis of the electric motor (the traveling driver) via the speed reducer. The rotation of the output axis of the electric motor is transmitted to the drive wheel via the speed reducer, and the rotation of the drive wheel drives the traveler 8 to travel. The traveling driver (the electric motor) may be a rotary motor, and may be a linear motor.

A mast 9 that extends in the vertical direction (in the perpendicular direction) is provided between the upper traveler 8 and the lower traveler 8. The mast 9 moves integrally with the upper traveler 8 and the lower traveler 8 (see FIG. 2). As shown in FIG. 1, the mast 9 is of a shape of a portion of a circle when viewed from above (in plan view), and an outer circumferential portion thereof has an arc shape. The mast 9 is, when viewed from above, of a C-shape and includes a cutout 9a having a shape in which a portion of a substantially semicircular shape is cut out. The mast 9 is supported via a rotational supporter (not shown in the drawings) so as to be able to rotate about a predetermined rotation axis parallel or substantially parallel to the direction perpendicular or substantially perpendicular to the traveler 8, and is driven by a rotation driver such as an electric motor (not shown in the drawings) to rotate (see FIG. 1). When the mast 9 rotates, the trajectory of an arc-shaped outer circumference 9b of the mast 9 is a substantially circular trajectory as viewed from above. When transferring the article F, the mast 9 rotates so that the article F faces in the direction of a transfer destination. When transporting the article F to the storage rack 2 on the +Y side, the mast 9 rotates so that the article F faces the +Y side as shown by the solid lines in FIG. 1. Also, when transporting the article F to the storage rack 2 on the −Y side, the mast 9 rotates so that the article F faces the −Y side as shown by the dashed lines in FIG. 1.

The transfer unit 10 transfers the article F to a predetermined position. The transfer unit 10 includes an elevation platform 14 and a transferer 15. The elevation platform 14 is arranged in the cutout 9a of the mast 9 (see FIG. 1). In a case where the elevation platform 14 is arranged in the cutout 9a of the mast 9, the transferer is able to be made in a compact size. The elevation platform 14 is raised or lowered along the mast 9 (see FIG. 2). The elevation platform 14 is guided by a guide 16 that is provided in the mast 9 and extends in the perpendicular direction. The elevation platform 14 is suspended from above by suspenders such as wires or the like. The transporter 1 includes a lift driver (not shown in the drawings) that drives the suspenders. The lift driver feeds out or winds up these suspenders. When the lift driver winds up the suspenders, the elevation platform 14 is raised by being guided by the mast 9. Also, when the lift driver feeds out the suspenders, the elevation platform 14 is lowered by being guided by the mast 9.

The transferer 15 transfers the article F. The transferer 15 is provided on the elevation platform 14. The transferer 15 is raised or lowered as the elevation platform 14 is raised or lowered (see FIG. 2). The transferer 15 includes an arm 18, a holder 19, and a rotation driver 20 (see FIG. 1). The arm 18 is a telescopic arm. The arm 18 includes two arms connected via a joint. The arm 18 is able to extend or retract in a horizontal direction as the arms bend at the joint. A proximal end side of the arm 18 is connected to the rotation driver 20. The holder 19 that positions and holds the article F is rotatably connected to a distal end side of the arm 18. When delivering the article F to the transfer destination as shown with the solid lines in FIG. 1, the transferer 15 extends the arm 18, and positions the article F held on the holder 19 above the transfer destination. Then, by lowering the elevation platform 14, the article F is delivered to the transfer destination from the holder 19. When the transferer 15 receives the article F from a transfer origin such as the storage rack 2, the arm 18 extends toward the article F placed at the transfer origin, and the holder 19 is positioned below the bottom surface of the article F. Then, in the transferer 15, the holder 19 picks up the article F as the elevation platform 14 is raised. Then, in the transferer 15, as shown with the dotted lines in FIG. 1, the arm 18 is retracted with the article F being held on the holder 19, and the holder 19 holds the article F above the elevation platform 14.

As described above, the transporter 1 includes the travelers 8 that travel through the traveling space SP, the mast 9 that is provided in the vertical direction from the travelers 8, and the outer circumferential portion of which has an arc shape in plan view, and the transfer unit 10 that is raised or lowered along the mast 9. Therefore, article F is able to be transferred efficiently by the transporter.

In some cases, a worker U may perform maintenance work in the stocker S. When performing the maintenance work, the worker U accesses the inside of the stocker S from the door 3 which separates the inside of the stocker S and the outside of the stocker S. The maintenance work performed by the worker U may be performed at a high place in the stocker S in some cases. The maintenance work at a high place in the stocker S is performed upon installing a high-place work platform.

As shown in FIG. 2, at each predetermined height, the stocker S of the present preferred embodiment includes, to the vicinity of the topmost portion of the stocker S, the door 3, a platform installer 22 that installs a work platform SC, and a floor surface 24. The platform installer 22 includes a pair of rails 4, platform members 5 (pallets), and a housing 6. The floor surface 24 provided at each height has a ladder (not shown in the drawings) provided thereon, and the worker U can move up or down to the floor 24 of each height using the ladder. As described above, since the stocker S of the present preferred embodiment enables installation of a platform at each predetermined height, maintenance work is able to be easily performed at each high place.

The pair of rails 4 support and guide the platform members 5 as shown in FIG. 2. As shown in FIG. 1, the pair of rails 4 flank the traveling space SP and extend in parallel or substantially in parallel in the horizontal direction (in the X direction). The pair of rails 4 extend from the inside of the housing 6 described later to the +X side end of the stocker S. Such a configuration enables movement and installation of the platform member 5 between the inside of the housing 6 and the +X side end of the stocker S.

Figure 3:
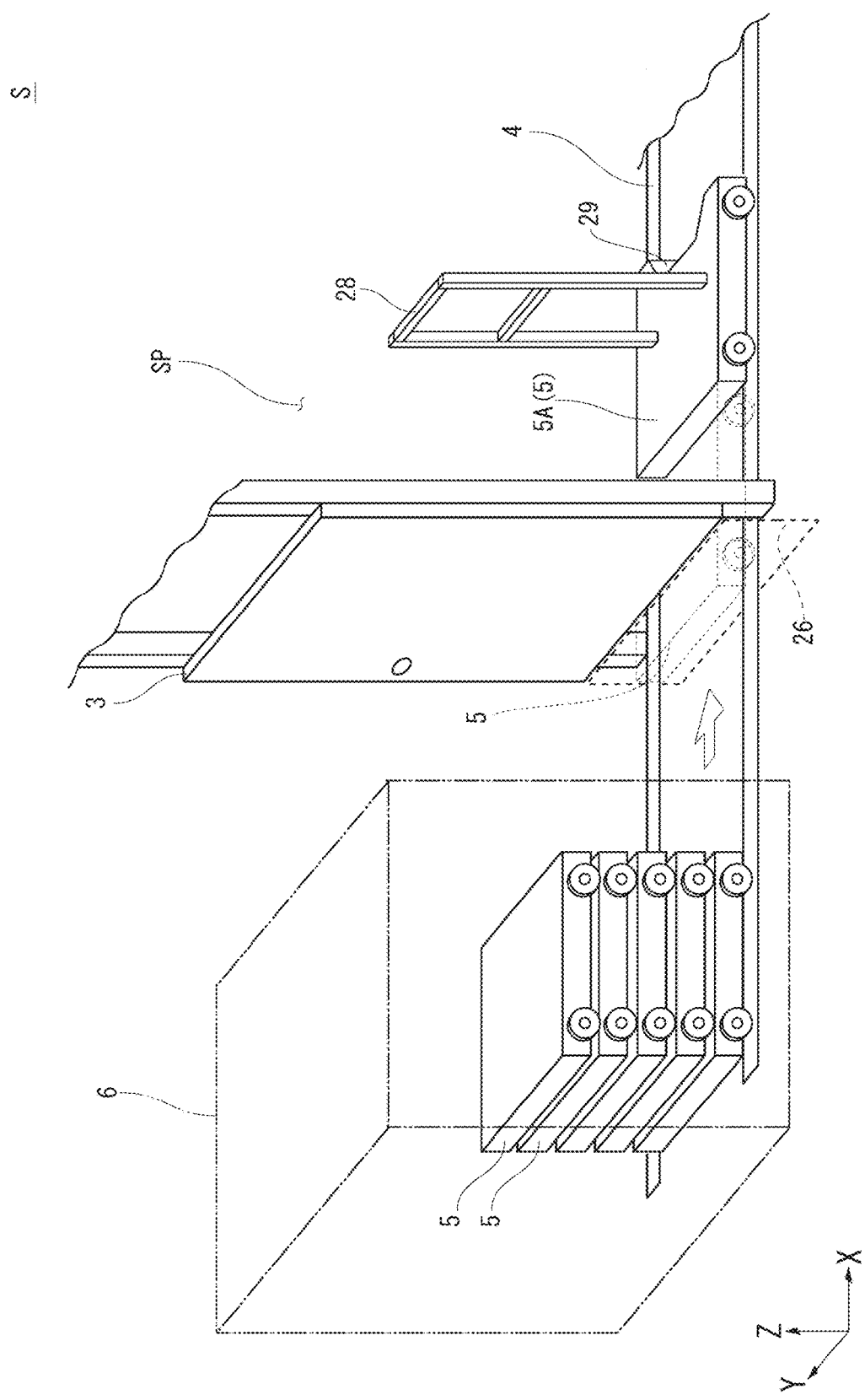
FIG. 3 is a perspective view showing a housing and a door.

FIG. 3 is a perspective view showing the housing and the door portion. As shown in FIG. 3, the pair of rails 4 extend from the inside of the stocker S to the housing 6 through directly below the door 3. An opening 26 is provided directly below the door 3. The opening 26 is used to allow the pair of rails 4 and the platform members 5 to travel between the outside and the inside of the stocker S. A Y direction width and a Z direction height of the opening 26 are set to create a clearance which allows the platform member 5 to pass through the opening 26. In a case where the opening 26 through which the pair of rails 4 and the platform member 5 can pass is provided directly below the door 3, the platform member 5 is able to be installed in the stocker S with the door 3 closed. In such a case, it is possible to restrict the worker U from entering the stocker S through the door 3 during the work of installing the platform members 5 in the stocker S. On the opening 26, a cover (not shown in the drawings) capable of opening and closing the opening 26 is provided. The opening 26 is closed by the cover when the platform member 5 is not installed. The opening 26 is opened by opening the cover when the platform member 5 is installed.

Figure 4:
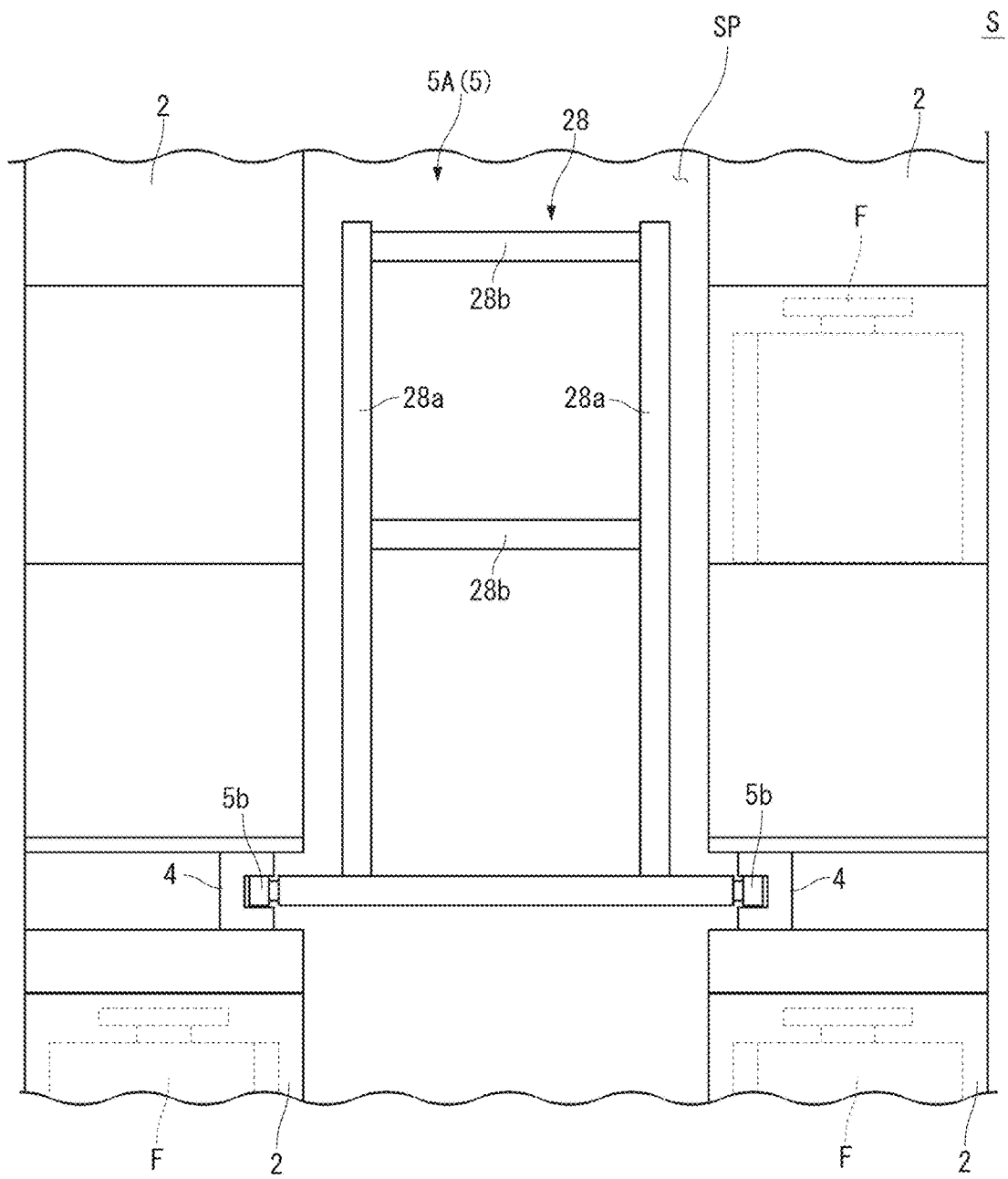
FIG. 4 is a diagram of inside of the stocker as viewed from outside of the stocker with the door open.
Figure 4:
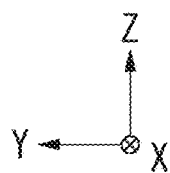

FIG. 4 is a diagram of the inside of the stocker as viewed from the outside of the stocker with the door open. The pair of rails 4 are arranged in a portion inside the storage rack 2 in the stocker S. The pair of rails 4 are arranged inside the storage racks 2 on the +Y side and the −Y side. Both ends of the platform member 5 are also arranged inside the storage racks 2 on the +Y side and the −Y side. Thus, when at least portions of the pair of rails 4 and the platform member 5 are arranged inside the storage racks 2 on the +Y side and the −Y side, the space between the +Y side storage rack 2 and the −Y side storage rack 2 is able to be covered by the platform member 5 without any gap. In such a case, falling of objects through the gap is able to be reliably prevented.

The pair of rails 4 each restrict the vertical movement and the horizontal movement (the Y direction movement) of the platform member 5. In such a case, the platform member 5 is able to be reliably supported and guided. The cross section of each of the pair of rails 4 orthogonal to the longitudinal direction of the rail 4 is of a C shape. The pair of rails 4 restrict the vertical movement and the horizontal movement (the Y direction movement) of the platform member 5 by having wheels 5b of the platform member 5 engaged into each C-shaped cross section.

Returning to the description of FIG. 2, the platform member 5 will be described. A plurality of the platform members are provided. Each platform member 5 has a rectangular or substantially rectangular plate shape, and by arranging the plurality of platform members 5, an integrated work platform SC is formed. Each platform member 5 includes a plurality of the wheels 5b (see FIGS. 5A to 5D), and can travel (move) along the pair of rails 4. The plurality of the wheels 5b are, as shown in FIG. 1, four wheels 5b that are provided on side surfaces on the +Y side and the −Y side of the platform member 5, respectively.

As shown in FIG. 2, at least one of the plurality of platform members 5 includes a fence 28. The fence 28 restricts the movement of the worker U. In the following description, the platform member 5 which includes the fence 28 is referred to as fenced platform member 5A. The fenced platform member 5A is positioned on the stocker S inner side with respect to the door 3 and on the door 3 side with respect to the traveling space SP (X direction) when the transporter 1 is traveling, including the time of transporting the article F by the transporter 1 (see FIG. 1). The fenced platform member 5A extends across the inside of the stocker S and the outside of the stocker S via the opening 26 (see FIG. 3) and while the fence 28 is arranged on the stocker S inner side (see the fenced platform member 5A shown with the solid lines in FIG. 2). With such a configuration, the fenced platform member 5A is arranged in a dead space DS out of the travel range of the transporter 1. When the fenced platform member 5A is positioned at the above position, the fence 28 stands upright in the vicinity of the door 3 when the door 3 is opened as shown in FIG. 4. As described above, in the case where the fenced platform member 5A is positioned on the stocker S inner side with respect to the door 3 and on the door 3 side with respect to the traveling space SP, or in the case where the fenced platform member 5A extends across the inside of the stocker S and the outside of the stocker S via the opening 26, and the fence 28 is arranged on the stocker S inner side, when the worker U opens the door 3 of the stocker while the work platform SC has not been formed, the fence 28 is standing upright on the stocker S inner side with respect to the door 3. Therefore, entry of the worker U into the stocker S through the door 3 is able to be restricted. Since the fenced platform member 5A extends across the inside of the stocker S and the outside of the stocker S via the opening 26 while the fence 28 is arranged on the stocker inner side and is arranged on the dead space DS, the fenced platform member 5A is able to be positioned without interfering with the traveling of the transporter 1. As shown by the dotted lines in FIG. 2, the fenced platform member 5A is firstly fed onto the pair of rails 4 when forming the work platform SC. Formation of the work platform SC will be described later in the operation section.

Next, the fence 28 will be described. As shown in FIG. 4, the fence 28 is provided standing upright on the platform member 5. The fence 28 is structured such that the upper end thereof is higher than the upper end of the opening 26 (see FIG. 3). The fence 28 includes a plurality of struts 28a and a plurality of horizontal portions 28b. The struts 28a each extend upward from the platform member 5 and are arranged side by side in a direction parallel to the Y direction. Each horizontal portion 28b extends in a direction parallel or substantially parallel to the Y direction. The horizontal portions 28b are each arranged between the plurality of struts 28a and connect the plurality of struts 28a. The horizontal portion 28b positioned topmost among the plurality of the horizontal portions 28b is set higher than the position of the waist of a worker U standing on the platform member (see FIG. 2). In the case where the fence 28 includes the plurality of struts 28a extending upward from the platform member 5 and the plurality of horizontal portions 28b arranged between the plurality of struts 28a, and where the horizontal portion 28b positioned topmost is set higher than the position of the waist of a worker U standing on the platform member 5, rigidity of the fence 28 is able to be improved by the plurality of struts 28a and the plurality of horizontal portions 28b. Also, since the horizontal portion 28b positioned topmost is higher than the position of the waist of the worker U, the topmost horizontal portion 28b is able to function as an effective fence for the worker U. The fence 28 is configured to meet the standards of JIS, OSHA (Occupational Safety and Health Administration) and so forth. In the present preferred embodiment, the fenced platform member 5A stably supports the fence 28, and therefore, the front (the +X side) wheels 5b thereof are provided so as to project farther forward than the platform member 5, and a distance (a wheel base) between the wheels 5b, 5b and the wheels 5b, 5b is longer than that of the platform member 5 (see FIG. 1).

Further, as shown in FIG. 1, the fenced platform member 5A is provided with a cutout 29. The cutout 29 is provided on a transporter 1 side (+X side). The cutout 29 is of a shape that corresponds to the shape of the mast 9. A portion of the mast 9 intrudes into the cutout 29. The cutout 29 is configured such that even when the transporter 1 moves to a position closest to the door 3 (a position on the −X side) and performs the rotation operation, as shown in FIG. 1, the movable range of the mast 9 is positioned in the cutout 29 and the cutout 29 does not interfere with the mast 9. As described above, in the case where the cutout 29 is provided in the platform member 5 which is closest to the mast 9 among the plurality of platform members 5, the platform member 5 is able to be located close to the mast 9, an outer circumferential portion of which has an arc shape by having the portion of the mast 9 intruding into the cutout 29. With such a configuration, since the gap between the mast 9 and the platform member 5 is made small or minimized, falling of objects through the gap is able to be reduced or prevented.

Figure 5A:
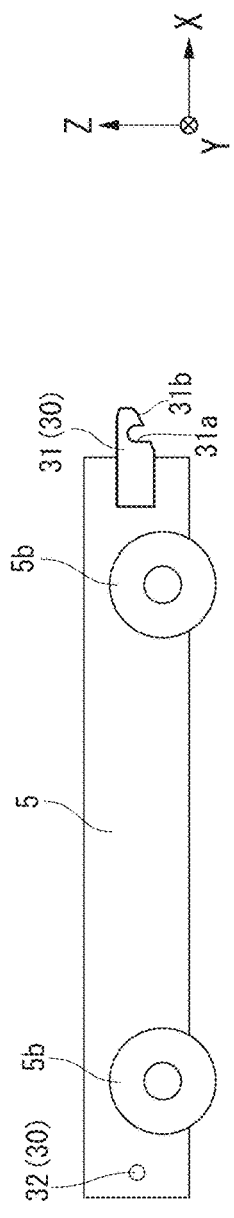
FIG. 5A is a side view showing a platform member.
Figure 5B:
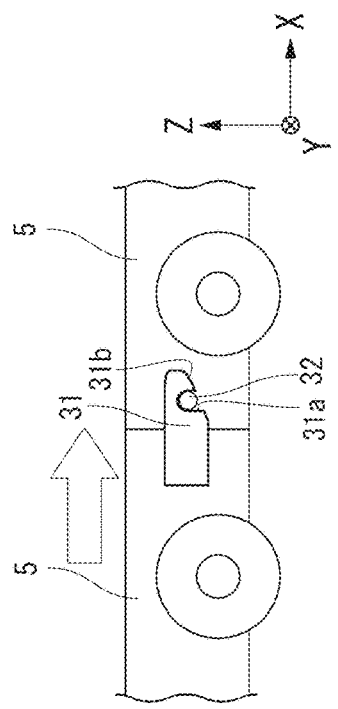
FIGS. 5B to 5D are diagrams showing an operation of coupling members.
Figure 5C:
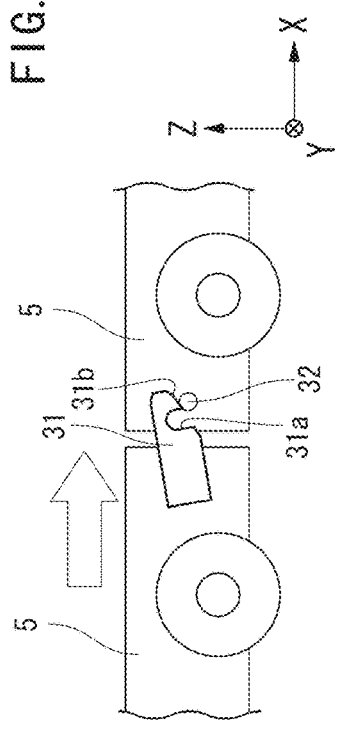
Figure 5D:
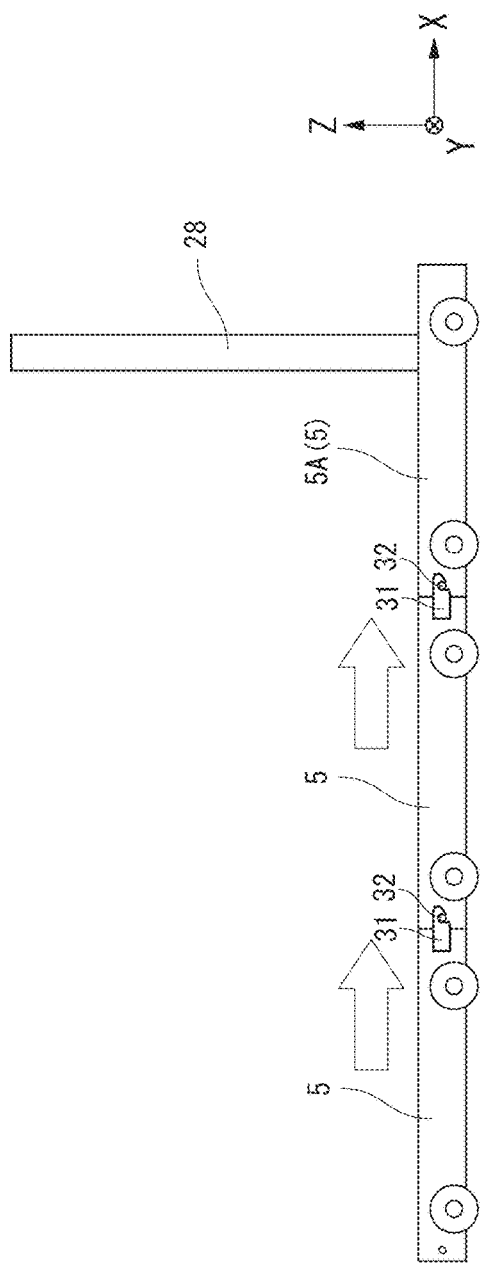

Next, coupling of the platform members 5 will be described. FIG. 5A is a side view showing the platform member 5 as viewed from the −Y direction. FIGS. 5B and 5C are diagrams showing an operation of a coupling member. FIG. 5D is a view showing a state in which a plurality of the platform members are coupled. Each platform member 5 includes coupling members 30 which couple a platform member 5 with another platform member 5. The coupling members 30 include a pair of projecting hooks 31 each projecting to the traveling direction side (the +X side) of the platform member 5, and a pair of engaging pins 32. The pair of projecting hooks 31 are provided on the side surfaces on the −Y side and the +Y side of the platform member 5. In a lower portion of each projecting hook 31, a cutout 31a which extends upward from the lower side thereof is provided. Each projecting hook 31 is inclined from a distal end thereof to an opening end of the cutout 31a, and the inclination defines and functions as an inclined portion 31b. The pair of engaging pins 32 are provided on the side surfaces on the −Y side and the +Y side of a portion on the opposite side (the −X side) to the traveling direction of the platform member 5.

Next, a coupling operation of the platform members 5 will be described. When coupling two platform members 5, as shown in FIGS. 5A to 5D, another platform member 5 is pressed from the rear side against the platform member 5 arranged in front (on the +X side) thereof to bring the projecting hooks 31 of the rear platform member 5 into contact with the engaging pins 32 of the front platform member 5. Then, each projecting hook 31 runs on the engaging pin 32 through the inclined portion 31b, and the engaging pin 32 engages with the cutout 31a as shown in FIG. 5C. With such configuration, the two platform members 5 are coupled. By repeating the above coupling operation, the plurality of platform members 5 are coupled as shown in FIG. 5D.

Returning to the description of FIG. 2, the housing 6 houses the plurality of platform members 5. The housing 6 is provided close to the stocker S outer side with respect to the door 3. The platform members 5 other than the fenced platform member 5A among the plurality of platform members 5 are housed within the housing 6 in a state of being stacked when the transporter 1 travels. In such a case, the plurality of platform members 5 are able to be efficiently stored. The pair of rails 4 extend to the inside of the housing 6 and are connected to the housing 6. The plurality of platform members 5 housed in the housing 6 can be fed directly from the housing 6 onto the rails 4 when in use. The plurality of platform members 5 used to form the work platform SC can be housed in the housing 6 directly from the pair of rails 4 at the time of housing the platform members 5. As described above, since the pair of rails 4 are connected to the housing 6, the work platform SC is able to be easily and simply formed. Moreover, since the plurality of platform members 5 is able to be housed easily, the burden on the worker U is reduced.

Figure 6:
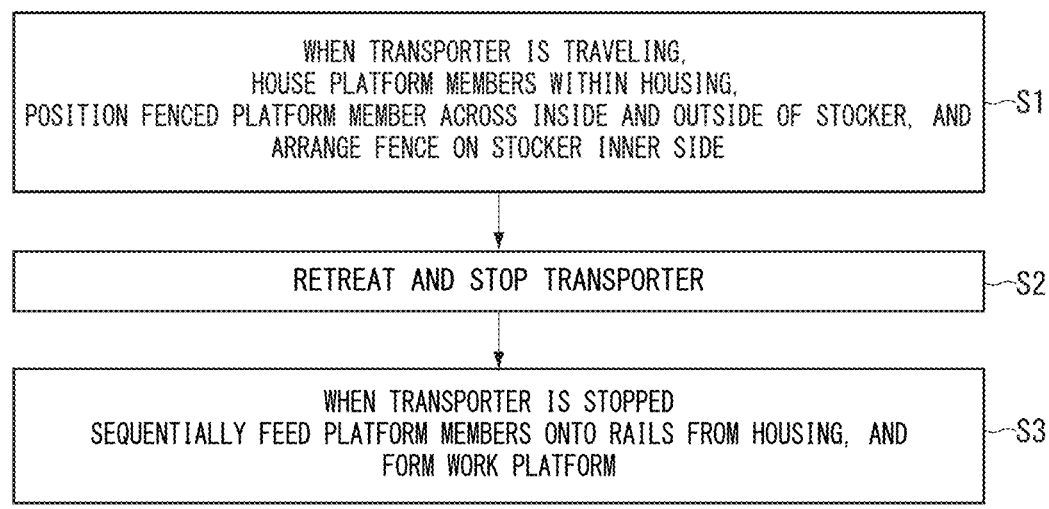
FIG. 6 is a flowchart showing a method for forming a work platform according to a preferred embodiment of the present invention.

Next, a method for forming a work platform according to a preferred embodiment of the present invention is described on the basis of an operation of the transporter 1. FIG. 6 is a flowchart showing an example of a method for forming a work platform. FIGS. 7A and 7B to FIG. 9 are diagrams showing operations of the stocker S. The method for forming a work platform is a method for forming a work platform in the stocker S.

Figure 7A:
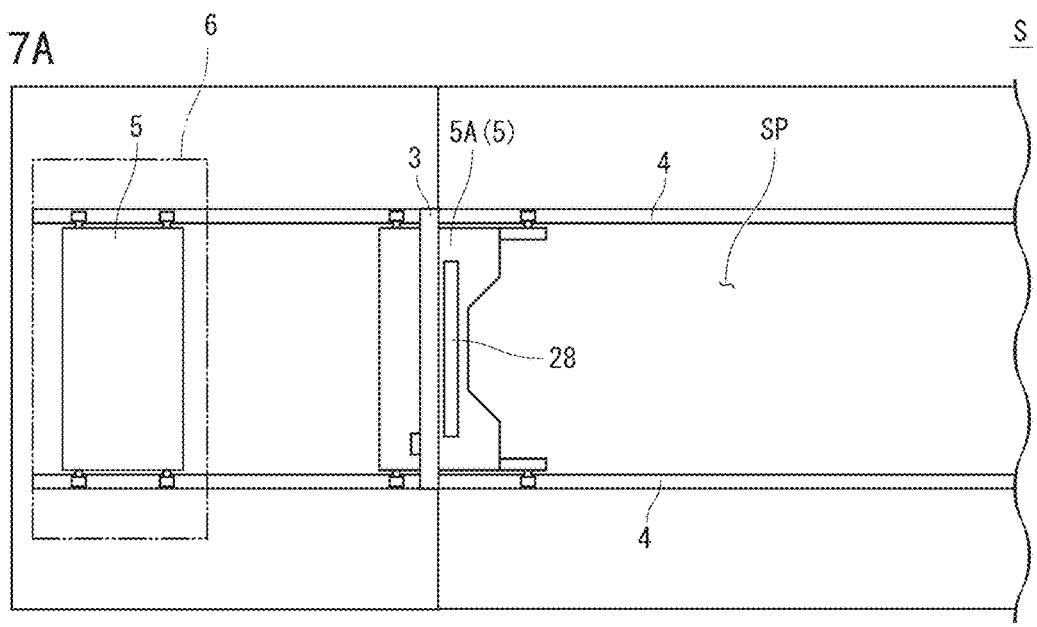
FIGS. 7A and 7B are explanatory diagrams of the method for forming a work platform.

In the stocker S, in Step S1 of FIG. 6, when the transporter 1 is traveling, the platform members 5 other than the fenced platform member 5A among the plurality of platform members 5 are housed in the housing 6, and the fenced platform member 5A is positioned across the inside of the stocker S and the outside of the stocker S via the opening 26 (see FIG. 3) while positioning the fence 28 on the stocker S inner side. The platform members 5 other than the fenced platform member 5A among the plurality of platform members 5 are housed within the housing 6 in the state of being stacked as shown in FIG. 2. With such a configuration, the plurality of platform members 5 can be efficiently stored. As shown in FIG. 7A, the fenced platform member 5A is positioned, on the pair of rails 4, on the stocker S inner side with respect to the door 3 and on the door 3 side with respect to the traveling space SP. With such a configuration, the fenced platform member 5A becomes the leading platform member 5 in the work platform SC. In the case of arranging the fenced platform member 5A in the position mentioned above, when the worker U opens the door 3 of the stocker while the work platform SC has not been formed, the fence 28 is standing upright on the stocker S inner side with respect to the door 3. Therefore, entry of the worker U into the stocker S through the door 3 is able to be restricted. Since the fenced platform member 5A is positioned at the position mentioned above when the transporter 1 travels, it is possible to reliably restrict the worker U from entering the stocker S through the door 3 while the transporter 1 is traveling.

Figure 7B:
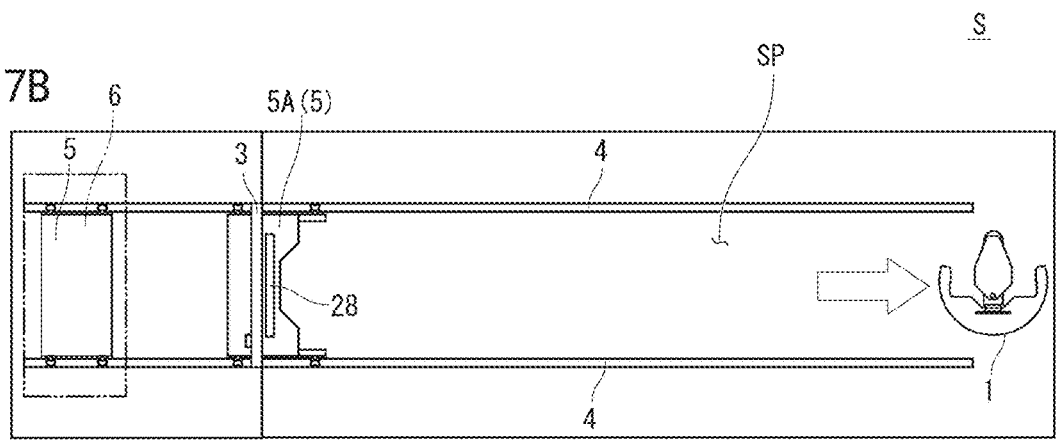

In the stocker S in some cases, the worker U may need to perform an operation such as maintenance work. In such a case, the work platform SC is formed at a place where work is required. Formation of the work platform SC is performed when the transporter 1 is in the stop state. Prior to forming the work platform SC, in Step S2 of FIG. 6, the transporter 1 is retreated and stopped. For example, as shown in FIG. 7B, the transporter 1 is moved (retreated) to and stopped at a +X side end of the stocker S. The transporter 1 need not be moved to the +X side end. For example, the position to which the transporter 1 is moved may be set according to the location of maintenance.

Figure 8A:
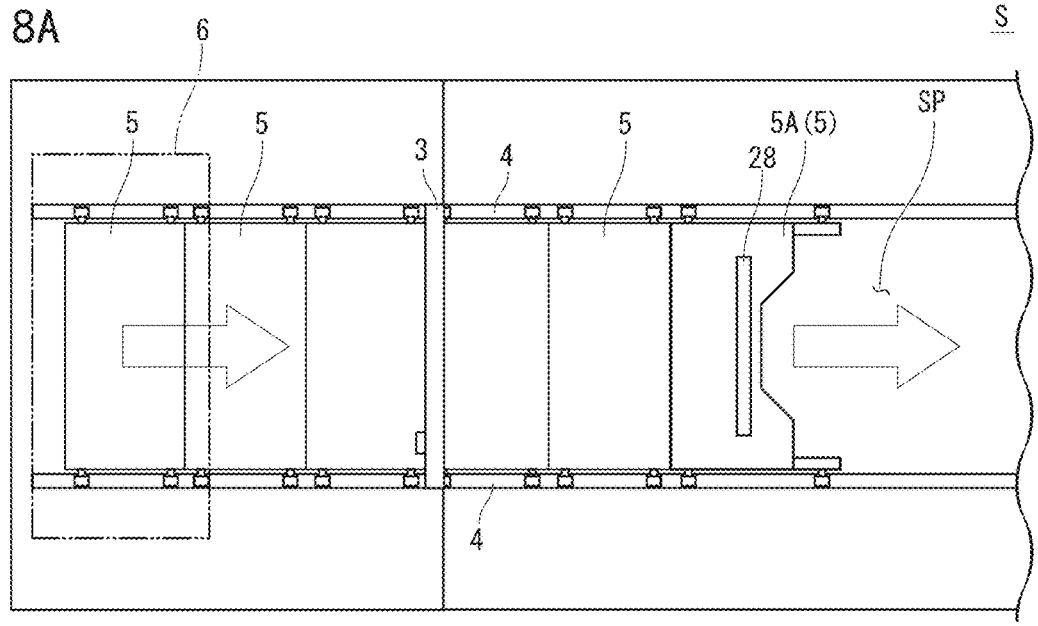
FIGS. 8A and 8B are explanatory diagrams of the method for forming a work platform, following FIGS. 7A and 7B.
Figure 8A:
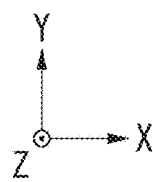
Figure 8B:
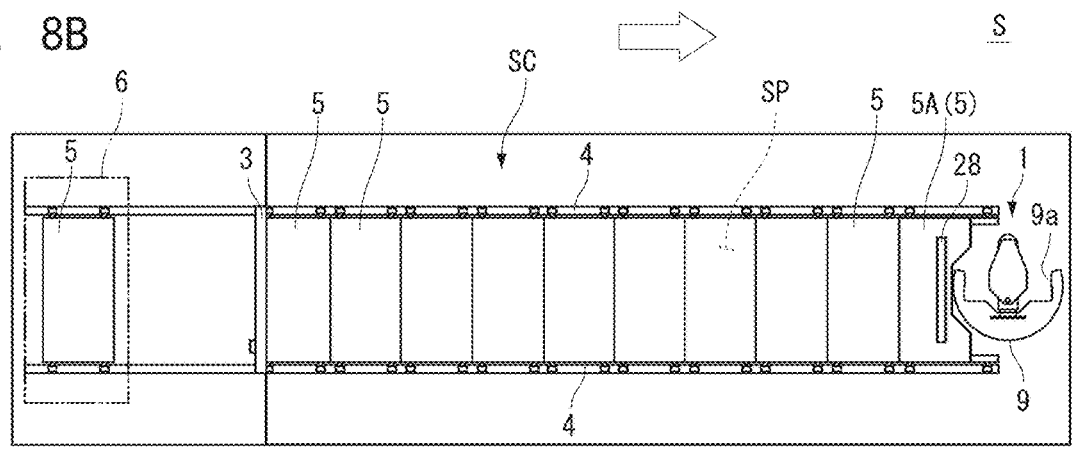
Figure 8B:
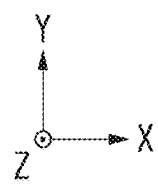
Figure 9:
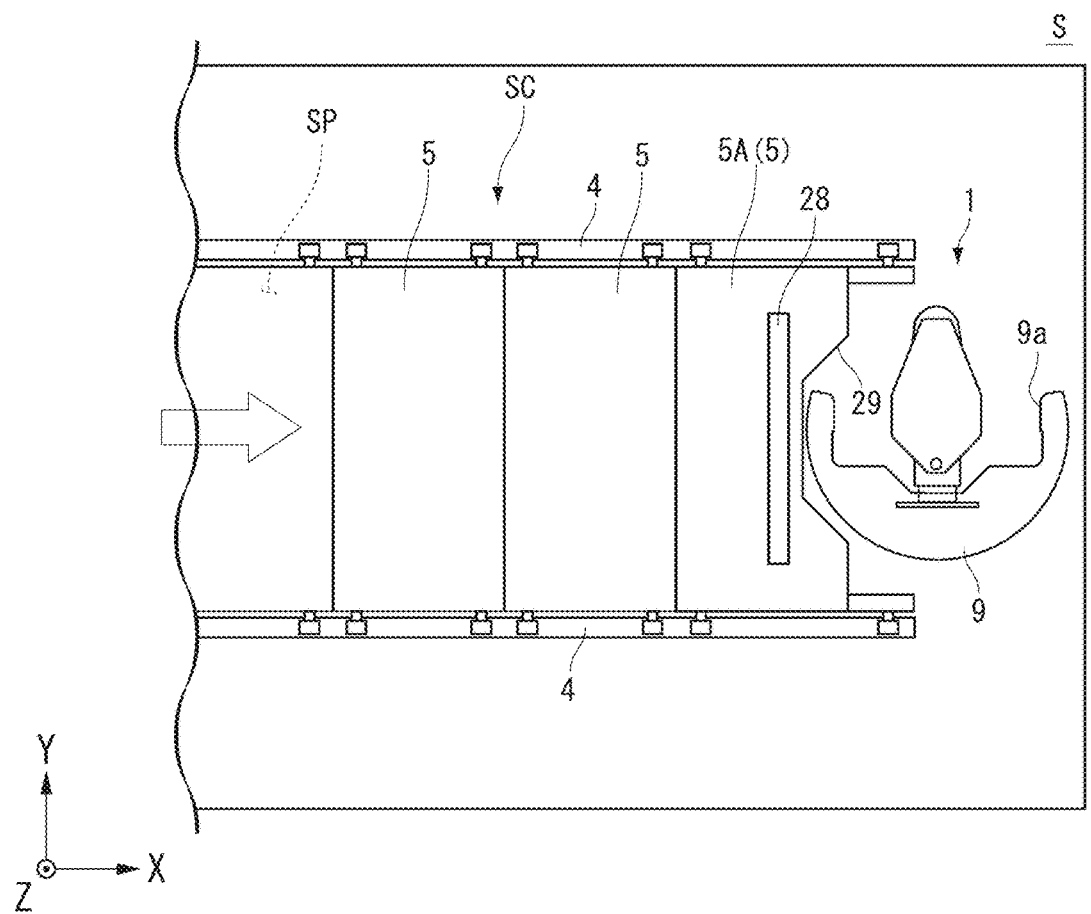
FIG. 9 is explanatory diagram of the method for forming a work platform, following FIGS. 8A and 8B.

Subsequently, in Step S3 of FIG. 6, the platform members 5, following the fenced platform member 5A, are fed sequentially onto the pair of rails 4 within the stocker S through the opening 26 from the housing 6 while the transporter 1 is in the stop state. For example, as shown in FIG. 8A, one platform member 5 is fed onto the rails 4 from the housing 6, and the platform member 5 is pressed against the fenced platform member 5A as shown in FIGS. 5A to 5C to couple the platform member 5 with the fenced platform member 5A in front thereof as shown in FIG. 5D. After having finished coupling the platform member 5 with the fenced platform member 5A in front thereof, the platform members 5 are sequentially fed onto the pair of rails 4 and the operation of coupling with the above platform member 5 in front is repeated. With such a configuration, the work platform SC is formed as shown in FIG. 8B. As described above, since formation of the work platform SC is performed while the transporter 1 is in the stop state, the contact between the platform member 5 and the transporter 1 is able to be suppressed or prevented when forming the work platform SC.

In the work platform SC formed as described above, as shown in FIG. 9, the platform member 5 is able to be arranged close to the mast 9, an outer circumferential portion of which has an arc shape, by having the portion of the mast 9 intruding into the cutout 29 of the fenced platform member 5A. With such a configuration, since the gap between the mast 9 and the platform member 5 is made small, falling of objects through the gap is able to be reduced or prevented. In the present preferred embodiment, since the fence 28 is provided on the fenced platform member 5A which is firstly fed onto the pair of rails 4, it is possible to easily form the work platform SC which includes the fence 28 at a leading position thereof, and the fence 28 is able to be positioned close to the stocker S inner side with respect to the door 3 when the work platform SC is not formed. In the present preferred embodiment, since the fenced platform member 5A is positioned on the stocker S inner side with respect to the door 3, it is possible to avoid interference which arises when the fenced platform member 5A passes through the opening 26 directly below the door 3.

According to the stocker S and the method for forming a work platform of preferred embodiments of the present invention, the platform member 5 which includes the fence 28 (the fenced platform member 5A) extends across the inside of the stocker S and the outside of the stocker S via the opening 26 while the fence 28 is arranged on the stocker S inner side. Therefore, the worker U is able to easily and simply form the work platform SC by feeding, after the platform member 5 which includes the fence 28, the other platform members 5 from the housing 6 sequentially onto the rails 4, thus reducing the burden on the worker U. Also, when the worker U opens the door 3 of the stocker while the work platform SC has not been formed, the fence 28 is standing upright on the stocker S inner side with respect to the door 3. Therefore, entry of the worker U into the stocker S through the door 3 is able to be restricted.

The preferred embodiments of the present invention have been described above. However, the present invention is not limited to the above description, and various modifications may be made without departing from the gist of the present invention. For example, in the preferred embodiments described above, the transporter 1 is described as being a stacker crane, however, the transporter 1 need not be a stacker crane, and an arbitrary transporter may be used. In the above preferred embodiments, the article F is described as being a FOUP, however, the article F need not be a FOUP. The stocker S can be applied to facilities of fields other than the semiconductor field.

In the preferred embodiments described above, the examples are described in which an outer circumferential portion of the mast 9 of the transporter 1 has an arc shape, however, the shape of the mast 9 is arbitrary. For example, the shape of the mast 9 may be, when viewed from above, a substantially rectangular shape (including a square shape) or an indeterminate shape.

In the preferred embodiments described above, the example is described in which the platform member 5 which includes the fence 28 (the fenced platform member 5A) is positioned on the stocker S inner side with respect to the door 3 and at the door 3 side closest position with respect to the traveling space SP (X direction). However, the position of the platform member 5 which includes the fence 28 is not limited to such a position. For example, when the transporter 1 travels, on the stocker S inner side, a plurality of platform members 5 may be provided between the platform member 5 which includes the fence 28 and the door 3.

In the preferred embodiments described above, the example is shown in which the platform member 5 which includes the fence 28 (the fenced platform member 5A) is positioned in the closest position to the transporter 1, among the plurality of platform members 5. However, the position of the platform member 5 which includes the fence 28 is not limited to such a position. For example, when the transporter 1 travels, on the stocker S inner side, a plurality of platform members 5 may be provided between the platform member 5 which includes the fence 28 and the transporter 1.

In the preferred embodiments described above, the examples are described in which the platform member 5 which includes the fence 28 (the fenced platform member 5A) includes the cutout 29. However, the platform member 5 which includes the cutout 29 need not be the fenced platform member 5A. For example, the platform member 5 which includes the cutout 29 is the platform member 5 closest to the mast 9 among the plurality of platform members 5, and may be the platform member 5 which does not include the fence 28. Furthermore, the platform member 5 need not include the cutout 29. For example, if the shape of the transporter 1 or the mast 9 is rectangular as viewed from above, the cutout 29 need not be included.

In the preferred embodiments described above, the examples are described in which the platform member 5 which includes the fence 28 (the fenced platform member 5A) is firstly fed onto the pair of rails 4. However, the platform member 5 which includes the fence 28 may be fed onto the pair of rails 4 at an arbitrary position other than the leading position. For example, the platform member 5 which includes the fence 28 may be fed onto the pair of rails 4 at any of the second position to the fifth position from the leading position.

Furthermore, the contents of Japanese Patent Application No. 2017-032048 and all documents cited in the detailed description of the present invention are incorporated herein by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A stocker comprising:
   a transporter that travels through a traveling space within a stocker and transports an article;
   a pair of rails that flank the traveling space and extend in parallel or substantially in parallel in a horizontal direction;
   a plurality of platforms movable along the pair of rails; and
   a housing that is provided on a stocker outer side of a door that separates an inside and an outside of the stocker, and that houses the platform; wherein
   the pair of rails extend from the inside of the stocker to the housing through an opening provided directly under the door;
   at least one of the plurality of platforms includes a fence in an upright standing position and an upper end of the fence is higher than an upper end of the opening; and
   the platform that includes the fence extends across the inside of the stocker and the outside of the stocker via the opening while the fence is located on a stocker inner side.

2. The stocker according to claim 1, wherein the fence is provided on the platform that is firstly fed onto the pair of rails.

3. The stocker according to claim 1, wherein
   the fence includes a plurality of struts extending upward from the platform, and a plurality of horizontal portions between the plurality of struts; and
   the horizontal portion positioned topmost is higher than a position of a waist of a worker standing on the platform.

4. The stocker according to claim 1, wherein the platforms other than the platform that includes the fence among the plurality of platforms are housed within the housing in a state of being stacked when the transporter travels.

5. The stocker according to claim 1, wherein the transporter includes a traveler that travels through the traveling space, a mast extending in a vertical direction from the traveler, an outer circumferential portion of the mast being of an arc shape in plan view, and a transferor that is raised or lowered along the mast.

6. The stocker according to claim 5, wherein the platform which is closest to the mast among the plurality of platforms is provided with a cutout into which the portion of the mast intrudes.

7. A method for forming a work platform in a stocker including a transporter that travels through a traveling space within a stocker and transports an article, the stocker including a pair of rails that flank the traveling space and extend in parallel or substantially in parallel in a horizontal direction, a plurality of platforms movable along the pair of rails, and a housing that is provided on a stocker outer side of a door that separates an inside and an outside of the stocker, and that houses the plurality of platforms, and the pair of rails extend from the inside of the stocker to the housing through an opening provided directly under the door, and at least one of the plurality of platforms includes a fence in an upright standing manner and an upper end of the fence is higher than an upper end of the opening, the method comprising:

housing the platforms other than the platform that includes the fence among the plurality of platforms within the housing in a state of being stacked when the transporter travels, and arranging the platform that includes the fence across the inside of the stocker and the outside of the stocker via the opening while arranging the fence on an inner side of the stocker; and feeding, after the platform that includes the fence, the platforms sequentially onto the pair of rails within the stocker through the opening from the housing when the transporter stops.

\* \* \* \* \*